US012695421B1

(12) United States Patent
Lin

(10) Patent No.: US 12,695,421 B1
(45) Date of Patent: Jul. 28, 2026

(54) INTEGRATED OSCILLATOR OF LOW NOISE

(71) Applicant: Realtek Semiconductor Corp., Hsinchu (TW)

(72) Inventor: Chia-Liang (Leon) Lin, Fremont, CA (US)

(73) Assignee: REALTEK SEMICONDUCTOR CORP., Hsinchu (TW)

( * ) Notice: Subject to any disclaimer, the term of this patent is extended or adjusted under 35 U.S.C. 154(b) by 0 days.

(21) Appl. No.: 19/245,459

(22) Filed: Jun. 23, 2025

(51) Int. Cl.
*H03B 5/12* (2006.01)

(52) U.S. Cl.
CPC ......... *H03B 5/1212* (2013.01); *H03B 5/1209* (2013.01); *H03B 5/1218* (2013.01); *H03B 5/1221* (2013.01); *H03B 5/1228* (2013.01); *H03B 5/1296* (2013.01); *H03B 2200/0088* (2013.01); *H03B 2200/009* (2013.01)

(58) Field of Classification Search
CPC .. H03B 5/1206; H03B 5/1209; H03B 5/1212; H03B 5/1215; H03B 5/1218; H03B 5/1221; H03B 5/1228; H03B 5/1231; H03B 5/1284; H03B 5/1296; H03B 2200/0088; H03B 2200/009
See application file for complete search history.

(56) References Cited

U.S. PATENT DOCUMENTS 10,498,289 B2 * 12/2019 Shu .......................... H03B 5/02
2007/0176703 A1 * 8/2007 Li ........................ H03B 5/1215
331/167

2010/0238843 A1 * 9/2010 Taghivand ........... H03B 5/1296
331/117 FE
2020/0212843 A1 * 7/2020 Hsueh .................. H03B 5/1212
2021/0351745 A1 * 11/2021 Sadhu .................. H03B 5/1296

OTHER PUBLICATIONS

Xi Meng et al, "Analysis and Design of a 15.2-to-18.2-GHz Inverse-Class-F VCO With a Balanced Dual-Core Topology Suppressing the Flicker Noise Upconversion," IEEE Transactions on Circuits and Systems—I: Regular Papers, vol. 70, No. 12, Dec. 2023.

* cited by examiner

*Primary Examiner* — Levi Gannon

(74) *Attorney, Agent, or Firm* — McClure, Qualey & Rodack, LLP

(57) ABSTRACT

An LC (inductor-capacitor) oscillator includes a first NMOS (n-channel metal oxide semiconductor) transistor, a first PMOS (p-channel metal oxide semiconductor) transistor, a second NMOS transistor, and a second PMOS transistor, wherein: the source of the first NMOS transistor is shorted to the source of the first PMOS transistor; the source of the second NMOS transistor is shorted to the source of the second PMOS transistor; the first NMOS transistor and the second NMOS transistor are cross coupled via a first gate inductor and a first drain inductor; the first and second PMOS transistors are cross coupled via a second gate inductor and a second drain inductor; the first NMOS transistor and the first PMOS transistor are coupled via a first gate capacitor and a first drain capacitor; and the second NMOS transistor and the second PMOS transistor are coupled via a second gate capacitor and a second drain capacitor.

10 Claims, 2 Drawing Sheets

100

100 ⤳

INTEGRATED OSCILLATOR OF LOW NOISE

BACKGROUND OF THE DISCLOSURE

Field of the Disclosure

The present disclosure generally relates to LC oscillator and particularly to inverse class-FLC oscillator of minimal parasitic inductance and more particularly to an LC oscillator that minimizes parasitic inductance.

Description of Related Art

An LC (inductor-capacitor) oscillator includes an LC tank comprising an inductor and a capacitor configured to form a resonant network to establish oscillation, and a regenerative network configured to provide energy to sustain the oscillation, which results in an oscillatory signal of an oscillation frequency approximately equal to a resonant frequency of the resonant network. The oscillatory signal is periodic in nature but subject to having a jittery timing resulting from circuit noises. The quality of the oscillatory signal is gauged by "phase noise," which characterizes how the timing of the oscillatory signal deviates from the ideal periodic timing.

As is known, the prior art has proposed an inverse Class-F LC oscillator that comprises a coupled LC network configured to embody the resonant network and a combination of a PMOS (p-channel metal oxide semiconductor) transistor and an NMOS (n-channel metal oxide semiconductor) transistor configured to embody the regenerative network. The inverse Class-F LC oscillator can have low phase noise by properly designing the impedance of the coupled LC network at a second harmonic frequency of the oscillatory signal. The source of the PMOS transistor connects to a power supply node, while the source of the NMOS transistor connects to a ground node. Ideally, both the power supply node and the ground node have zero impedance. In practice, however, the physical connection (to the power supply node and the ground node) is implemented using a conduction metal, which by nature results in a parasitic inductance that degrades the effectiveness of the regenerative network embodied by the PMOS transistor and the NMOS transistor. Limited by the nature of the circuit topology, it is very difficult to eliminate parasitic inductance.

What is desired is an inverse class-F LC oscillator that can minimize or, better yet eliminate, the parasitic inductance.

BRIEF SUMMARY OF THIS INVENTION

An objective of this present invention is to have an inverse class-F LC (inductor-capacitor) oscillator of minimal parasitic inductance.

In an embodiment, an LC (inductor-capacitor) oscillator comprising a first NMOS (n-channel metal oxide semiconductor) transistor, a first PMOS (p-channel metal oxide semiconductor) transistor, a second NMOS transistor, and a second PMOS transistor, wherein: the source of the first NMOS transistor is shorted to the source of the first PMOS transistor; the source of the second NMOS transistor is shorted to the source of the second PMOS transistor; the first NMOS transistor and the second NMOS transistor are cross coupled via a first gate inductor and a first drain inductor; the first PMOS transistor and the second PMOS transistor are cross coupled via a second gate inductor and a second drain inductor; the first NMOS transistor and the first PMOS transistor are coupled via a first gate capacitor and a first drain capacitor; and the second NMOS transistor and the second PMOS transistor are coupled via a second gate capacitor and a second drain capacitor In an embodiment, a LC oscillator comprises: a first NMOS transistor with source, gate, and drain connected to a first node, a second node, and a third node, respectively; a second NMOS transistor with source, gate, and drain connected to a fourth node, a fifth node, and a sixth node, respectively; a first PMOS transistor with source, gate, and drain connected to the first node, a seventh node, and an eighth node, respectively; a second PMOS transistor with source, gate, and drain connected to the fourth node, a nineth node, and a tenth node, respectively; a first gate inductor inserted between the second node and the fifth node with a center tap connected to a first gate bias node; a second gate inductor inserted between the seventh node and the nineth node with a center tap connected to a second gate bias node; a first drain inductor inserted between the third node and the sixth node with a center tap connected to a power supply node; a second drain inductor inserted between the eighth node and the tenth node with a center tap connected to a ground node; a first gate capacitor inserted between the second node and the seventh node; a second gate capacitor inserted between the fifth node and the nineth node; a first drain capacitor inserted between the third node and the eighth node; and a second drain capacitor inserted between the sixth node and the tenth node.

In an embodiment, a LC oscillator comprises: a first NMOS transistor, a first PMOS transistor, a second NMOS transistor, and a second PMOS transistor, wherein: the source of the first NMOS transistor is shorted to the source of the first PMOS transistor; the source of the second NMOS transistor is shorted to the source of the second PMOS transistor; the gate of the first NMOS transistor links to the gate of the second NMOS transistor through a first gate inductor, of which a center tap connects to a first gate bias node; the gate of the first PMOS transistor links to the gate of the second PMOS transistor through a second gate inductor, of which a center tap connects to a second gate bias node; the drain of the first NMOS transistor links to the drain of the second NMOS transistor through a first drain inductor, of which a center tap connects to a power supply node; the drain of the first PMOS transistor links to the drain of the second PMOS transistor through a second drain inductor, of which a center tap connects to a ground node; the gate of the first NMOS transistor links to the gate of the first PMOS transistor through a first gate capacitor; the gate of the second NMOS transistor links to the gate of the second PMOS transistor through a second gate capacitor; the drain of the first NMOS transistor links to the drain of the first PMOS transistor through a first drain capacitor; the drain of the second NMOS transistor links to the drain of the second PMOS transistor through a second drain capacitor; the first gate inductor is strongly coupled to the second drain inductor; and the second gate inductor is strongly couple to the first drain inductor.

DETAILED DESCRIPTION OF THIS INVENTION

The present invention relates to LC oscillators. While the specification describes several example embodiments of the invention considered favorable modes of practicing the invention, it should be understood that the invention can be implemented in many ways and is not limited to the particular examples described below or to the particular manner in which any features of such examples are implemented. In other instances, well-known details are not shown or described to avoid obscuring aspects of the invention.

Persons of ordinary skill in the art understand terms and basic concepts related to microelectronics that are used in the context of this disclosure, such as "voltage," "bias," "(circuit) node," "signal," "power supply," "ground," "PMOS (p-channel metal oxide semiconductor) transistor," "short (circuit)," "NMOS (n-channel metal oxide semiconductor) transistor," "frequency," "inductor," "capacitor," "inductance," "oscillator," "phase noise," and "timing jitter." Terms and basic concepts like these in the context of this present disclosure are apparent to those of ordinary skill in the art and thus will not be explained in detail.

Those of ordinary skill in the art can also readily recognize a symbol of a MOS (metal-oxide semiconductor) transistor, either p-channel or n-channel, and its associated "source," "gate," and "drain" terminals. Terms and basic concepts like these are apparent to those of ordinary skill in the art and thus will not be explained in detail here. For brevity, in this present disclosure, in a context of referring to a MOS transistor, a "source terminal" is simply referred to as "source," a "gate terminal" is simply referred to as "gate," and a "drain terminal" is simply referred to as "drain."

Those of ordinary skill in the art can recognize symbols of commonly used circuit elements such as NMOS transistor, PMOS transistor, inductor, capacitor, and therefore can read a schematic diagram and understand interconnections between circuit elements therein without the need of detailed descriptions.

A circuit is a collection of a transistor, a capacitor, an inductor, a resistor, and/or other electronic devices interconnected in a certain manner to embody a certain function. A network is a circuit or a collection of circuits configured to embody a certain function.

In this present disclosure, a "circuit node" is simply referred to as a "node" for short, as the meaning is clear from a context of microelectronics and won't cause confusion.

A first node is said to be "shorted" to a second node when an impedance between the first node and the second node is zero in an engineering sense, i.e., the impedance is smaller than an engineering tolerance of interest.

Figure 1:
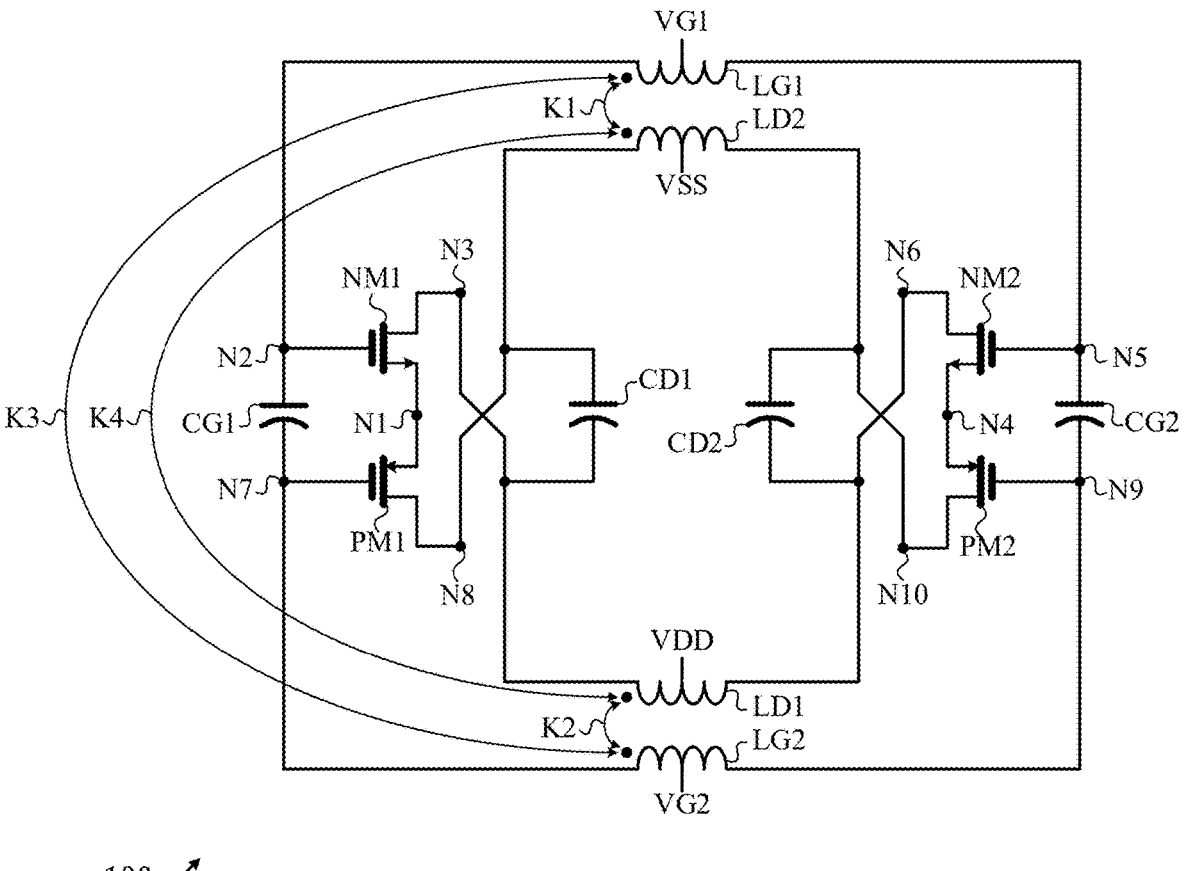
FIG. 1 shows a schematic diagram of an LC oscillator in accordance with an embodiment of the present invention.

As shown in FIG. 1, an LC oscillator 100 in accordance with an embodiment of the present invention comprises: a first NMOS transistor NM1 with source, gate, and drain connected to a first node N1, a second node N2, and a third nod N3, respectively; a second NMOS transistor NM2 with source, gate, and drain connected to a fourth node N4, a fifth node N5, and a sixth node N6, respectively; a first PMOS transistor PM1 with source, gate, and drain connected to the first nod N1, a seventh node N7, and an eighth node N8, respectively; a second PMOS transistor with source, gate, and drain connected to the fourth node N4, a nineth node N9, and a tenth node N10, respectively; a first gate inductor LG1 inserted between the second node N2 and the fifth node N5 with a center tap connected to a first gate bias node VG1; a first drain inductor LD1 inserted between the third node N3 and the sixth node N6 with a center tap connected to a power supply node VDD; a second gate inductor LG2 inserted between the seventh node N7 and the ninth node N9 with a center tap connected to a second gate bias node VG2; a second drain inductor LD2 inserted between the eighth node N8 and the tenth node N10 with a center tap connected to a ground node VSS; a first gate capacitor CG1 inserted between the second node N2 and the seventh node N7; a second gate capacitor CG2 inserted between the fifth node N5 and the nineth node N9; a first drain capacitor CD1 inserted between the third node N3 and the eighth node N8; and a second drain capacitor CD2 inserted between the sixth node N6 and the tenth node N10. LG1 (LG2) is called a gate inductor because it connects to the gates of NM1 (PM1) and NM2 (PM2). Likewise, CG1 (CG2) is called a gate capacitor because it connects to the gates of NM1 (NM2) and PM1 (PM2). LD1 (LD2) is called a drain inductor because it connects to the drains of NM1 (PM1) and NM2 (PM2). Likewise, CD1 (CD2) is called a drain capacitor because it connects to the drains of NM1 (NM2) and PM1 (PM2).

The first gate inductor LG1 is strongly coupled to the second drain inductor LD2 with a first coupling coefficient K1. Likewise, the second gate inductor LG2 is strongly coupled to the first drain inductor LD1 with a second coupling coefficient K2. The first gate inductor LG1 is coupled, at least moderately, to the second gate inductor LG2 with a third coupling coefficient K3. Likewise, the first drain inductor LD1 is coupled, at least moderately, to the second drain inductor LD2 with a fourth coefficient K4. In an embodiment, K1 and K2 are higher than 0.5, while K3 and K4 are higher than 0.25. Regarding a mutual coupling between two inductors, having a coupling coefficient higher than 0.5 can be considered "strongly coupled," while having a coupling coefficient higher than 0.25 can be considered "at least moderately coupled." Note that, given two inductors, the coupling coefficient between the two inductors is defined as the mutual inductance between the two inductors divided by the geometric mean of the inductance of the two inductors.

LG1, CG1, LG2, and CG2 are configured in a ring topology to form a resonant network to establish oscillation. The four transistors (NM1, NM2, PM1, and PM2) form a regenerative network to sustain the oscillation. For instance, a rising of the gate voltage of NM1 at N2 leads to a falling of the drain voltage of NM1 at N3 due to the inverting nature of transistor, causing a current flow from N6 to N3 through LD1, thus through coupling K2 inducing a current flow from N7 to N9 through LG2 and then back to N2 through CG2 and LG1, causing a further rising of the gate voltage of NM1 at N2, and therefore a positive feedback is formed and a regenerative function is fulfilled.

LD2, CD1, LD1, and CD2 are also configured in a ring topology to establish a proper impedance at a second harmonic frequency of the oscillation to suppress phase noise. The underlying principle is consistent with that of the aforementioned prior art inverse class-F LC oscillator proposed by Xi Meng et al. However, the LC oscillator 100 differs from the prior art LC oscillator in that, the source of PMOS transistor PM1 (PM2) is directly shorted to the source of NMOS transistor NM1 (NM2) at the first node N1 (fourth node N4), without the need to use an interconnection metal trace. This arrangement effectively eliminates the parasitic inductance that exists in the prior art LC oscillator. Therefore, the LC oscillator 100 is inherently superior to the prior art LC oscillator.

The LC oscillator 100 is biased through bias voltages provided at the first gate bias node VG1 and the second gate bias node VG2. In an embodiment, the first gate bias node VG1 is electrically shorted to the power supply node VDD, while the second gate bias node VG2 is electrically shorted to the ground node VSS. To ensure the LC oscillator 100 can sustain oscillation, all the four transistors (NM1, NM2, PM1, and PM2) must be biased in "saturation region"; in other words, the voltage difference between the power supply node VDD and the ground node VSS must be greater than a sum of the threshold voltage of NM1 (NM2) and the threshold voltage of PM1 (PM2). Concepts of "bias," "threshold voltage," and "saturation region" pertaining to MOS transistors are well understood by those of ordinary skill in the art and thus not further explained here.

Figure 2:
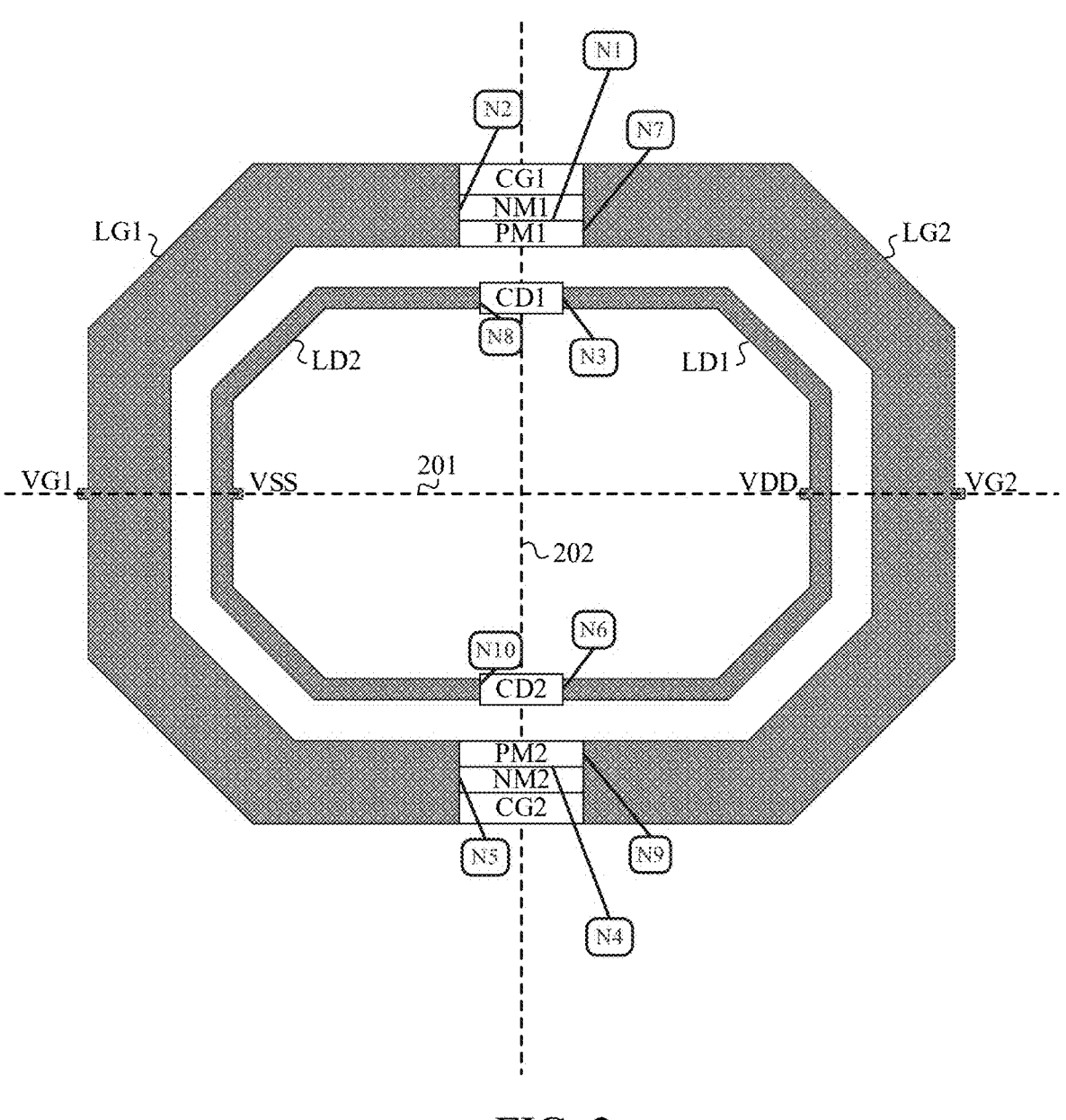
FIG. 2 shows a top view of a layout of the LC oscillator of FIG. 1 in accordance with an embodiment of the present invention.

In an embodiment, the LC oscillator 100 is integrated and fabricated on a silicon substrate using a CMOS (complementary metal oxide semiconductor) process technology of a multi-layer planar structure comprising a plurality of metal layers, including an ultra-thick metal (UTM) layer, and various device layers for constructing transistors. A top view of an exemplary layout of the LC oscillator 100 is shown in FIG. 2. The LC oscillator 100 is laid out symmetrically with respect to a plane of symmetry 201, which is perpendicular to the planar structure and appears as a line as seen from the top view. LG1, CG1, LG2, and CG2 form an outer ring, while LD2, CD1, LD1, and CD2 form an inner ring. LG1 is laid out on the UTM layer as a first outer half ring on the left side of a central line 202 perpendicular to the plane of symmetry 201, while LG2 is laid out on the UTM layer as a second outer half ring on the right side of the central line 202. Likewise, LD2 is laid out on the UTM layer as a first inner half ring on the left side of the central line 202 and strongly coupled to LG1, while LD1 is laid out on the UTM layer as a second inner half ring on the right side of the central line 202 and strongly coupled to LG2. NM1 and PM1 share the same source (laid out around the central line) and are directly shorted (at N1), while NM2 and PM2 share the same source (laid out around the central line) and are directly shorted (at N4). As a result, the parasitic inductance resulting from interconnection metal trace is eliminated.

Those skilled in the art will readily observe that numerous modifications and alterations of the device and method may be made while retaining the teachings of the disclosure. Accordingly, the above disclosure should not be construed as limited only by the metes and bounds of the appended claims.

What is claimed is:

1. An LC (inductor-capacitor) oscillator comprising:
a first NMOS (n-channel metal oxide semiconductor) transistor with source, gate, and drain connected to a first node, a second node, and a third node, respectively;
a second NMOS transistor with source, gate, and drain connected to a fourth node, a fifth node, and a sixth node, respectively;
a first PMOS (p-channel metal oxide semiconductor) transistor with source, gate, and drain connected to the first node, a seventh node, and an eighth node, respectively;
a second PMOS transistor with source, gate, and drain connected to the fourth node, a nineth node, and a tenth node, respectively;
a first gate inductor inserted between the second node and the fifth node with a center tap connected to a first gate bias node;
a second gate inductor inserted between the seventh node and the nineth node with a center tap connected to a second gate bias node;
a first drain inductor inserted between the third node and the sixth node with a center tap connected to a power supply node;
a second drain inductor inserted between the eighth node and the tenth node with a center tap connected to a ground node;

a first gate capacitor inserted between the second node and the seventh node;
a second gate capacitor inserted between the fifth node and the nineth node;
a first drain capacitor inserted between the third node and the eighth node; and
a second drain capacitor inserted between the sixth node and the tenth node.

2. The LC oscillator of claim 1, wherein the first gate inductor is strongly coupled to the second drain inductor, and the second gate inductor is strongly coupled to the first drain inductor.

3. The LC oscillator of claim 1, wherein the first gate inductor is coupled, at least moderately, to the second gate inductor, and the first drain inductor is coupled, at least moderately, to the second drain inductor.

4. The LC oscillator of claim 1 being integrated and laid out upon a multi-layer planar structure and symmetrical with respect to a plane of symmetry that is perpendicular to the multi-layer planar structure.

5. The LC oscillator of claim 4, wherein the first gate inductor and the second gate inductor are configured as two outer half rings laid out on opposite sides of a central line that is perpendicular to the plane of symmetry, while the first drain inductor and the second drain inductor are configured as two inner half rings laid out on opposite sides of the central line.

6. The LC oscillator of claim 5, wherein the source of the first NMOS transistor and the source of the first PMOS transistor are laid out around the central line and directly shorted at the first node, while the source of the second NMOS transistor and the source of the second PMOS transistor are laid out around the central line and directly shorted at the fourth node.

7. An LC (inductor-capacitor) oscillator comprising a first NMOS (n-channel metal oxide semiconductor) transistor, a first PMOS (p-channel metal oxide semiconductor) transistor, a second NMOS transistor, and a second PMOS transistor, wherein:
source of the first NMOS transistor is shorted to source of the first PMOS transistor;
source of the second NMOS transistor is shorted to source of the second PMOS transistor;
gate of the first NMOS transistor links to gate of the second NMOS transistor through a first gate inductor, of which a center tap connects to a first gate bias node;
gate of the first PMOS transistor links to gate of the second PMOS transistor through a second gate inductor, of which a center tap connects to a second gate bias node;
drain of the first NMOS transistor links to drain of the second NMOS transistor through a first drain inductor, of which a center tap connects to a power supply node;
drain of the first PMOS transistor links to drain of the second PMOS transistor through a second drain inductor, of which a center tap connects to a ground node;
the gate of the first NMOS transistor links to the gate of the first PMOS transistor through a first gate capacitor;
the gate of the second NMOS transistor links to the gate of the second PMOS transistor through a second gate capacitor;
the drain of the first NMOS transistor links to the drain of the first PMOS transistor through a first drain capacitor;
the drain of the second NMOS transistor links to the drain of the second PMOS transistor through a second drain capacitor;

the first gate inductor is strongly coupled to the second
   drain inductor; and the second gate inductor is strongly coupled to the first
   drain inductor.

8. The LC oscillator of claim 7 being integrated and laid
out upon a multi-layer planar structure and symmetrical with
respect to a plane of symmetry that is perpendicular to the
multi-layer planar structure.

9. The LC oscillator of claim 8, wherein the first gate
inductor and the second gate inductor are configured as two
outer half rings laid out on opposite sides of a central line
that is perpendicular to the plane of symmetry, while the first
drain inductor and the second drain inductor are configured
as two inner half rings laid out on opposite sides of the
central line.

10. The LC oscillator of claim 9, wherein the source of the
first NMOS transistor and the source of the first PMOS
transistor are laid out around the central line and directly
shorted, while the source of the second NMOS transistor and
the source of the second PMOS transistor are laid out around
the central line and directly shorted.

\* \* \* \* \*